MODE COUPLED DISCRIMINATOR

Filed Nov. 8, 1967

Inventor
BEN H. HERMAN
BY Mueller, Aichele and Rauner
ATTYS.

United States Patent Office 3,487,318
Patented Dec. 30, 1969

3,487,318
MODE COUPLED DISCRIMINATOR

Ben H. Herman, Prospect Heights, Ill., assignor to Motorola, Inc., Franklin Park, Ill., a corporation of Illinois Filed Nov. 8, 1967, Ser. No. 681,482
Int. Cl. H03k 7/06
U.S. Cl. 329—117 11 Claims

ABSTRACT OF THE DISCLOSURE

A discriminator circuit uses a single crystal to form two pairs of tuned circuits each pair resonant at a different frequency. The frequency modulation signal to be detected is coupled to each pair of tuned circuits and the resulting output signals are separately rectified and combined to form an amplitude modulated signal proportional to the frequency modulated signal. The resonant circuit pairs can be formed on separate crystals as well as the same crystal.

BACKGROUND OF THE INVENTION

In frequency modulation receivers a discriminator circuit incorporating a pair of tuned resonant circuits may be used to detect the frequency modulated signal. These resonant circuits have been provided by the conventional combination of inductance and capacitance. With the increasing use of integrated circuits, however, it has become desirable to miniaturize the resonant circuits used in discriminators. In the present state of the art, it is very difficult to form capacitors of sufficiently high capacitance in integrated circuits for use in a discriminator and there is no way in which the required inductance can be formed as part of an integrated circuit. While prior art discriminator circuits using crystals have been described, coils and capacitors have been made a part of the resonant circuit structure of these systems.

SUMMARY OF THE INVENTION

It is, therefore, an object of this invention to provide a discriminator circuit in which capacitors and inductors are not required in the resonant circuit of the discriminator.

Another object of this invention is to provide a discriminator circuit which can be produced in a miniaturized form.

In practicing this invention a discriminator circuit is provided, including a piezoelectric crystal having four pairs of electrodes thereon. Two pairs of the electrodes from first and second resonant circuits which are resonant at a frequency greater than the center frequency of the FM signal to be detected. The electrodes in the first and second resonant circuits are positioned on the piezoelectric crystal for specified coupling between the first and second resonant circuits. Two pairs of electrodes forming third and fourth resonant circuits, resonant at a frequency less than the center frequency of the FM signal, are also provided on the same crystal with the electrodes of the third and fourth resonant circuits being positioned for specified coupling between them. The electrodes are also positioned on the piezoelectric crystal so that the coupling between the first and fourth resonant circuits and the third and second resonant circuits is at a minimum. An input circuit couples the FM signal to the first and third resonant circuits. An output circuit is coupled to the second and fourth resonant circuits and separately rectifies the output signal from each and combines the rectified output signal to develop a signal of varying amplitude proportional to the frequency modulated signal. While the basic structure of this invention consists of two resonant circuits formed on a single crystal, the two resonant circuits can be separately formed on two crystals.

The invention is illustrated in the drawings of which:

DESCRIPTION OF THE INVENTION

Figures 1, 2, 3, 4, 5, 6:
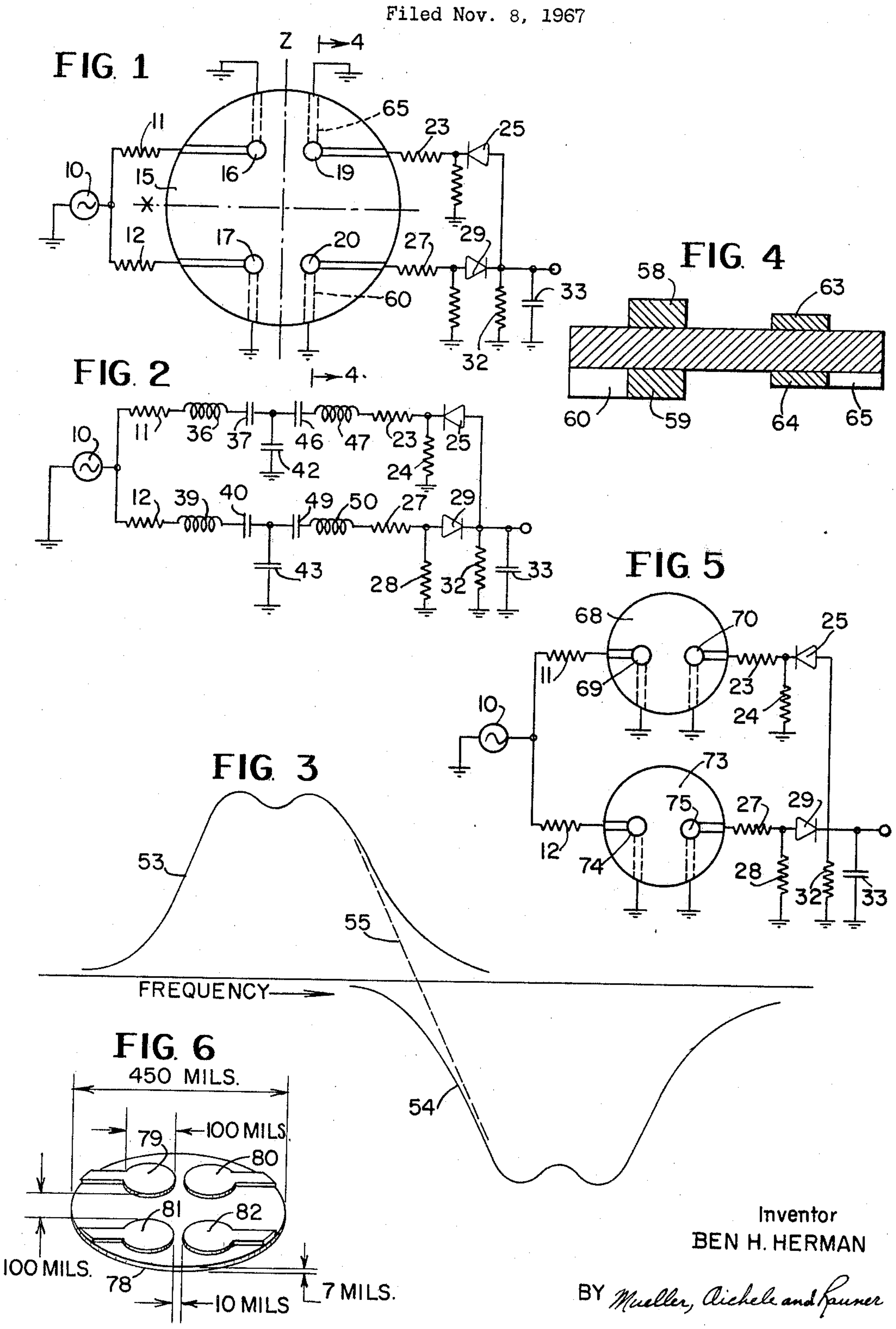
FIG. 1 is a schematic showing the structure of the circuit of this invention.
FIG. 2 is an equivalent circuit of the circuit of FIG. 1.
FIG. 3 is a set of curves showing the frequency response of the circuit of FIGS. 1 and 2.
FIG. 4 is a cross-sectional view of a portion of the piezoelectric crystal of FIG. 1.
FIG. 5 is a schematic showing another embodiment of the invention using separate crystals for the resonant circuit structure.
FIG. 6 is a view of a piezoelectric crystal showing the relative size of the resonant circuit structure.

In FIG. 1 there is shown a schematic of a circuit incorporating the features of this invention. A signal generator 10 is shown which provides a frequency modulated signal having a particular center frequency. The frequency modulated signal may be obtained from a signal generator as shown in FIG. 1 or it may be the output of a receiver IF amplifier and limiter. Signal generator 10 is coupled to a pair of electrodes 16 on piezoelectric crystal 15 through resistor 11 and a pair of electrodes 17 on piezoelectric crystal 15 through resistor 12. Piezoelectric crystal 15 together with the pairs of electrodes 16 and 19 plated thereon form first and second resonant circuits respectively which are resonant at a frequency higher than the center frequency of the FM signal. Pairs of electrodes 17 and 20 together with piezoelectric crystal 15 form third and fourth resonant circuits respectively which are resonant at a frequency lower than the center frequency of the FM signal. The output signal from the second resonant circuit is coupled to rectifier 25 through resistor 23 and the output of the fourth resonant circuit is coupled to rectifier 29 through resistor 27. Rectifiers 25 and 29 are poled to produce output signals of opposite polarities which are combined across resistor 32 and filtered by capacitor 33. The resulting combined signal is an amplitude varying signal proportional to the frequency modulated signal and may be detected in a conventional manner.

In FIG. 2 there is shown an equivalent circuit of FIG. 1 in which identical components have the same reference numerals. The first resonant circuit is shown as inductance 36 and capacitance 37. Inductance 47 and capacitance 46 form the second resonant circuit. Capacitance 42 represents the coupling between the first and second resonant circuits through piezoelectric crystal 15. Inductance 39 and capacitance 40 form the third resonant circuit, and inductance 50 and capacitance 49 form the fourth resonant circuit. Capacitance 43 represents the coupling between the third and fourth resonant circuits through piezoelectric crystal 15. By proper formation of the pairs of electrodes, the first and second resonant circuits can be made resonant at a frequency different from the third and fourth resonant circuits.

In FIG. 3 curve 54 shows the frequency response of the first and second resonant circuits as detected by rectifier 25 and curve 53 shows the frequency response of the third and fourth resonant circuits as detected by rectifier 29. The resulting frequency response of the discriminator is shown in curve 55. Curve 55 is essentially linear within a frequency range which is made equal to the deviation of the frequency modulated signal. Thus the output signal appearing across resistor 32 and capacitor 33 is a signal of varying amplitude in which the amplitude modulation is proportional to the frequency modulation of the FM signal.

Referring to FIGS 1 and 4 the manner in which the crystal structure is formed to produce a pair of resonant circuits will be described. Each of the pairs of electrodes 16, 17, 19 and 20 is formed by a metallic plated area positioned on opposite sides of the crystal. These areas may be formed by gold plating and are shown as areas 58 and 59 and areas 63 and 64 of FIG. 4. Conductors, shown as 60 and 65, are formed on the crystal and connected to each of the plated areas forming the electrodes. The conductors run to the edge of the crystal where connections may be made to exterior circuits. The conductors may be formed during the same plating process which forms the metallic areas comprising the electrodes.

The crystal is normally constructed to be resonant at a frequency higher than the final required frequency. When the electrodes are plated onto the crystals the frequency of the resonant circuits produced is reduced in accordance with the thickness of the plating. It is normal practice to "plate back" or lower the crystal frequency 100 kHz. However, by increasing the thickness of the plating a reduction in frequency of 500 kHz. can easily be obtained. Thus, as shown in FIG. 4, the thickness of metallic areas 58 and 59 are greater than the thickness of the metallic areas 63 and 64 so that the frequency of the resonant circuit including the electrodes formed by metallic areas 58, 59 would be lower than the frequency of the resonant circuit including the electrodes formed by the metallic areas 63 and 64. By varying the thickness of the plating applied to the crystals, the difference between the center frequencies of the resonant circuits formed on the crystal can be adjusted as desired. This difference in plating thickness determines the difference between the center frequencies of the frequency response curves 53 and 54 of FIG. 3, and thus the slope and linearity of the combined output curve 55 of FIG. 3.

In order to provide proper operation of the circuit the pairs of electrodes are positioned on the crystals so that the coupling between the pairs of electrodes 16 and 19 is greater than the coupling between the pairs of electrodes 16 and 20, and the coupling between the pairs of electrodes 17 and 20 is greater than the coupling between the pairs of electrodes 17 and 19. Normally the pairs of electrodes would be positioned on the crystal so that the coupling between the pairs of electrodes 16 and 19 and the couplings between the pairs of electrodes 17 and 20 would be a specified value while the coupling between the pairs of electrodes 16 and 20 and the pairs of electrodes 17 and 19 would be a minimum. An example of the placement of the pairs of electrodes on the crystal is shown in FIG. 1 where the crystal 15 is an AT cut crystal. The pairs of electrodes 16, 17, 19 and 20 are so positioned on the crystal that a line joining the pairs of electrodes 16 and 19 and a line joining the pairs of electrodes 17 and 20 are parallel to the X axis of the crystal while a line joining the pairs of electrodes 16 and 17 and a line joining the pairs of electrodes 19 and 20 are parallel to the Z axis of the crystal. In order to provide the best coupling conditions the distance between the pairs of electrodes 16 and 19 and the pairs of electrodes 17 and 20 is specified by the resonator design while the distance between the pairs of electrodes 16 and 17 and the pairs of electrodes 19 and 20 is made as large as possible.

In FIG. 1 the pairs of electrodes are positioned on a single crystal. However, the discriminator circuit can be formed on separate crystals if it is desirable to have wider frequency spacing between the center frequency of the response curves of the two resonant circuits, and to minimize any coupling or manufacturing problems. In the circuit of FIG. 5 the first resonant circuit is formed on piezoelectric crystal 68 having pairs of electrodes 69 and 70 while the second resonant circuit is formed on piezoelectric crystal 73 having pairs of electrodes 74 and 75. The input circuits and output circuits of FIG. 5 are identical with those of FIG. 1 and have the same reference numerals. Crystals 68 and 73 may be AT cut crystals with pairs of electrodes 69 and 70 and pairs of electrodes 74 and 75 positioned on lines parallel to the X axis of the crystals.

FIG. 6 shows the dimensions of a crystal structure having the features of this invention. However, the invention is not limited to structures of these dimensions but can be made smaller or larger as is desirable. The piezoelectric crystal shown has a diameter 450 mils and a thickness of 7 mils. The electrodes are formed of gold plated metallic areas 100 mils in diameter. The spacing between pairs of electrodes 79 and 80, forming the first and second resonant circuits, is 10 mils and the spacing between pairs of electrodes 81 and 82 forming the third and fourth resonant circuits is 10 mils. The spacing between the pairs of electrodes forming the first and third resonant circuits and the second and fourth resonant circuits is 100 mils. While the above example illustrates the operation of the circuit with a frequency modulated signal the discriminator can be used with any type of signal to develop an output signal having a magnitude proportional to the frequency of the input signal.

I claim:

1. A crystal discriminator for detecting an input signal to develop a detected signal therefrom, including in combination, a piezoelectric crystal having first, second, third and fourth pairs of electrodes thereon, said first, second, third and fourth pairs of electrodes and said piezoelectric crystal forming first, second, third and fourth resonant circuits respectively, said first and second resonant circuits being resonant at a first frequency, said third and fourth resonant circuits being resonant at a second frequency less than said first frequency, each of said pair of electrodes further being positioned on said piezoelectric crystal so that the coupling between said first and second resonant circuits is greater than the coupling between the first and fourth resonant circuits and the coupling between said third and fourth resonant circuits is greater than the coupling between said third and second resonant circuits, input circuit means coupled to said first and third pairs of electrodes, said input circuit means being adapted to receive the input signal and couple the same to said first and third resonant circuits, the input signal being coupled from said first resonant circuit to said second resonant circuit to develop a first output signal, from said third resonant circuit to said fourth resonant circuit to develop a second output signal, and output circuit means coupled to said second and fourth pairs of electrodes for combining said first and second output signals to develop a detected signal proportional to the frequency of the input signal.

2. The crystal discriminator of claim 1 wherein, said input circuit means includes first resistance means coupling the input signal to said first pair of electrodes and second resistance means coupling the input signal to said third pair of electrodes.

3. The crystal discriminator of claim 1 wherein, each of said pairs of electrodes is formed by a plated metallic area on opposite sides of said piezoelectric crystal with said metallic areas forming each pair of electrodes being positioned opposite each other.

4. A crystal discriminator for detecting a frequency modulated signal having a particular center frequency including in combination, a piezoelectric crystal having first, second, third and fourth pairs of electrodes thereon, said first, second, third and fourth pairs of electrodes and said piezoelectric crystal forming first, second, third and fourth resonant circuits respectively, said first and second resonant circuits being resonant at a first frequency greater than the particular center frequency, said third and fourth resonant circuits being resonant at a second frequency less than the particular center frequency, each of said pairs of electrodes further being positioned on said piezoelectric crystal so that the lines joining said first and second pairs of electrodes and said third and fourth pairs of electrodes are parallel to the axis of maximum coupling and that the lines joining said first and third pairs of electrodes and said second and fourth pairs of electrodes are parallel to the axis of minimum coupling, input circuit means coupled to said first and third pairs of electrodes, said input circuit means being adapted to receive the frequency modulated signal and couple the same to said first and third resonant circuits, the frequency modulated signal being coupled from said first resonant circuit to said second resonant circuit to develop a first output signal and from said third resonant circuit to said fourth resonant circuit to develop a second output signal, and output circuit means, coupled to said second and fourth pairs of electrodes for combining said first and second output signals to develop a signal of varying amplitude proportional to the modulation of the frequency modulated signal.

5. The crystal discriminator of claim 4 wherein, said piezoelectric crystal is an AT cut crystal, said first and second pairs of electrodes and said third and fourth pairs of electrodes being positioned along lines parallel with the X axis of said piezoelectric crystal and said first and third pairs of electrodes and said second and fourth pairs of electrodes being positioned along lines parallel with the Z axis of said piezoelectric crystal.

6. The crystal discriminator of claim 4 wherein, said output circuit means includes first rectifier means coupled to said second pairs of electrodes and poled to develop said first output signal having a particular polarity, second rectifier means coupled to said fourth pair of electrodes and poled to develop said second output signal having a polarity opposite to the polarity of said first output signal, and resistance means coupled to said first and second rectifier means for combining said first and second output signals to develop said signal of varying amplitude.

7. The crystal discriminator of claim 4 wherein, said input circuit means includes first resistance means coupling the frequency modulated signal to said first pair of electrodes and second resistance means coupling the frequency modulated signal to said third pair of electrodes.

8. The crystal discriminator of claim 4 wherein, each of said electrodes is formed by a metallic area plated on said piezoelectric crystal with said metallic areas forming each pair of electrodes being positioned opposite each other.

9. The crystal discriminator of claim 8 wherein, the thickness of plating of at least one metallic area of each of the pairs of metallic areas forming said third and fourth pairs of electrodes is greater than the thickness of plating of at least one metallic area of each of the pairs of metallic areas forming said first and second pairs of electrodes, whereby the resonant frequency of said third and fourth resonant circuits is less than the resonant frequency of said first and second resonant circuits.

10. A crystal discriminator for detecting a frequency modulated signal having a particular center frequency including in combination, a first piezoelectric crystal having first and second pairs of electrodes thereon and forming with said first piezoelectric crystal first and second resonant circuits respectively, said first and second resonant circuits being resonant at a first frequency greater than the particular center frequency, a second piezoelectric crystal having third and fourth pairs of electrodes thereon and forming with said second piezoelectric crystal third and fourth resonant circuits being resonant at a second frequency less than the particular center frequency, input circuit means including a single input terminal coupled to said first and third pairs of electrodes, said input circuit means being adapted to receive the frequency modulated signal from said input terminal and couple the same with the same phase to said first and third resonant circuits, the frequency modulated signal being coupled from said first resonant circuit to said second resonant circuit to develop a first output signal and from said third resonant circuit to said fourth resonant circuit to develop a second output signal, and output circuit means coupled to said second and fourth pairs of electrodes for combining said first and second output signals to develop a signal of varying amplitude proportional to the frequency modulated signal.

11. The crystal discriminator of claim 10 wherein, said first and second piezoelectric crystals are AT cut crystals, said first and second pairs of electrodes being positioned along a line parallel with the X axis of said first piezoelectric crystal and said third and fourth pairs of electrodes being positioned along a line parallel with the X axis of the second piezoelectric crystal.

References Cited

UNITED STATES PATENTS

| | | | |
|---|---|---|---|
| 2,374,735 | 5/1945 | Crosby | 325—487 |
| 2,271,870 | 2/1942 | Mason | 310—9.5 X |
| 3,074,021 | 1/1963 | Rullman | 329—117 |
| 3,253,166 | 5/1966 | Osial et al. | 329—117 X |
| 3,401,276 | 9/1968 | Curran et al. | 333—72 X |
| 3,416,036 | 12/1968 | Ho | 331—116 X |

ALFRED L. BRODY, Primary Examiner

U.S. Cl. X.R.

307—308, 233; 310—8.2; 329—198; 331—116; 333—72